United States Patent
Lin et al.

(10) Patent No.: US 7,743,491 B2
(45) Date of Patent: Jun. 29, 2010

(54) MOUNTING METHOD OF PASSIVE COMPONENT

(75) Inventors: Wen-Shin Lin, Taoyuan (TW); Wei-Chih Wang, Kaohsiung (TW)

(73) Assignee: Advaced Semiconductor Engineering, Inc., Kaohsiung (TW)

( * ) Notice: Subject to any disclaimer, the term of this patent is extended or adjusted under 35 U.S.C. 154(b) by 390 days.

(21) Appl. No.: 11/783,078

(22) Filed: Apr. 5, 2007

(65) Prior Publication Data
US 2007/0234561 A1    Oct. 11, 2007

(30) Foreign Application Priority Data
Apr. 7, 2006    (TW)    .............................. 95112388 A

(51) Int. Cl.
*H05K 3/30* (2006.01)
(52) U.S. Cl. .............................. 29/832; 29/825; 29/840; 438/455
(58) Field of Classification Search ................... 29/825, 29/832, 840; 438/455
See application file for complete search history.

(56) References Cited

U.S. PATENT DOCUMENTS

| | | | | |
|---|---|---|---|---|
| 5,749,997 A * | 5/1998 | Tang et al. | ................... | 156/249 |
| 5,801,074 A * | 9/1998 | Kim et al. | ................... | 438/125 |
| 5,861,678 A * | 1/1999 | Schrock | ................... | 257/783 |
| 6,356,453 B1 * | 3/2002 | Juskey et al. | ................... | 361/760 |
| 6,546,620 B1 * | 4/2003 | Juskey et al. | ................... | 29/840 |
| 6,627,824 B1 * | 9/2003 | Lin | ................... | 174/268 |
| 6,798,072 B2 * | 9/2004 | Kajiwara et al. | ................... | 257/778 |
| 2002/0027294 A1 * | 3/2002 | Neuhaus et al. | ................... | 257/778 |
| 2002/0056906 A1 * | 5/2002 | Kajiwara et al. | ................... | 257/697 |
| 2005/0045379 A1 * | 3/2005 | Sakurai et al. | ................... | 174/260 |
| 2006/0292824 A1 * | 12/2006 | Beyne et al. | ................... | 438/455 |
| 2007/0045812 A1 * | 3/2007 | Heng | ................... | 257/693 |

* cited by examiner

*Primary Examiner*—C. J Arbes
(74) *Attorney, Agent, or Firm*—Rabin & Berdo, P.C.

(57) ABSTRACT

The present invention relates to a mounting method of passive component, and particularly relates to a mounting method of a small-size passive component. A passive component partially covered by an adhesive material is provided. Before the adhesive layer is melted, the adhesive material is melted and then solidified to form a fixing structure between the passive component and a substrate for fixing the passive component on the substrate. Therefore, the tombstone problem caused by uneven pulling force that the melted solder applies to the two ends of the passive component is effectively solved. The yield rate is increased, and the product loss is reduced.

3 Claims, 4 Drawing Sheets

MOUNTING METHOD OF PASSIVE COMPONENT

This application claims the benefit of Taiwan application Serial No. 95112388, filed Apr. 7, 2006, the subject matter of which is incorporated herein by reference.

BACKGROUND OF THE INVENTION

1. Field of the Invention

The invention relates in general to a mounting method of a passive component, and more particularly to a mounting method of a passive component for solving the tombstone problem of the passive component caused by uneven pulling force that the melted solder applies to the two ends of the passive component.

2. Description of the Related Art

In the present package manufacturing process or the assembly process, the passive component is mounted alone or together with other components on the substrate or circuit board according to the demand. The surface mount technology (SMT) is the most common mounting method nowadays because of the advantages including fast manufacturing speed, high precision and high repeatability.

Please referring to FIGS. 1A~1C, a conventional surface mounting method is illustrated in FIGS. 1A~1C. First, as shown in FIG. 1A, solder paste 14 is printed on each contact pad 12 disposed on a surface of a substrate 10 (or circuit board) in a stencil printing process. Next, as shown in FIG. 1B, two ends of a passive component 16 are placed on the solder paste 14 disposed on the surfaces of the contact pads 12. Then, as shown in FIG. 1C, the solder paste 14 is melted and then solidified in a reflowing process for bonding the passive component 16 onto the substrate 10, so that the passive component 16 is electrically connected with the contact pads 12 of the substrate 10.

However, the amount of the solder paste on each contact pad in the present surface mount technology is often slightly different due to the inaccuracy of the manufacturing process. For example, the size of each opening of the stencil is not always the same, and the stencil and the substrate may not be positioned accurately. As a result, the pulling force that the melted solder applies to the two ends of the passive component is uneven in the reflowing process. Or, the uneven pulling force may be caused when the passive component is misaligned on the contact pads. When the pulling forces applied to the two ends of the passive component are not equivalent, the passive component is not positioned accurately. The slight inaccuracy of the positioning process of the passive component usually does not affect the product quality and the yield rate a lot.

However, as the electronic products become more compact and light-weight, all the components become smaller accordingly. The passive component is no exception. When the passive component becomes smaller, the uneven pulling force that the melted solder applies to the two ends of the passive component affects the mounting process more, especially in the passive component with size smaller than size of grade 0402. Please refer to FIG. 2. The tombstone phenomenon defined as the raising of one end of the passive component takes place when the pulling force that the melted solder applies to the two ends of the passive component is uneven. The conventional surface mounting method fails, and the yield rate is decreased. Therefore, a mounting method of a passive component with size smaller than size of grade 0402 is desperately needed to solve the tombstone problem of the passive component caused by uneven pulling force that the melted solder applies to the two ends of the passive component.

SUMMARY OF THE INVENTION

The invention is directed to a mounting method of a passive component, and more particularly to mounting method of a passive component with size smaller than the size of grade 0402.

The invention is also directed to a mounting method of a passive component for solving the tombstone problem caused by uneven pulling force that the melted solder applies to the two ends of the passive component, for easing the yield rate and for reducing the product loss.

The invention is further directed to a mounting method of a passive component for fixing the passive component, so that the passive component is not misaligned because of the swaying of the passive component or the flowing of the solder paste in the reflowing process.

According to the present invention, a mounting method of a passive component is provided. First, a substrate with a pair of contact pads formed on a surface of the substrate is provided. Next, an adhesive layer is formed on surfaces of the pair of contact pads. Then, a passive component partially covered by an adhesive material is placed on the pair of contact pads. Afterwards, a heat treatment is performed, so that the adhesive material flows to the substrate before the adhesive layer is melted. Later, the adhesive material is solidified to form a fixing structure connecting the substrate and the passive component to fix the passive component on the substrate.

Therefore, in the mounting method of the passive component of the present invention, a fixing structure is formed to fix the passive component on the substrate. The tombstone problem caused by uneven pulling force that the melted solder paste applies to the two ends of the passive component is solved effectively. The passive component is not misaligned because of the swaying of the passive component or the flowing of the solder paste in the reflowing process. The yield rate is increased, and the product loss is reduced.

The invention will become apparent from the following detailed description of the preferred but non-limiting embodiments. The following description is made with reference to the accompanying drawings.

DETAILED DESCRIPTION OF THE INVENTION

Figure 1A:
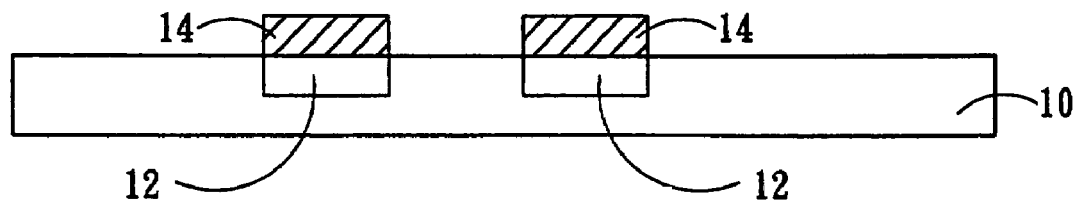
FIGS. 1A~1C (Prior Art) show a conventional surface mounting method of a passive component.
Figure 1B:
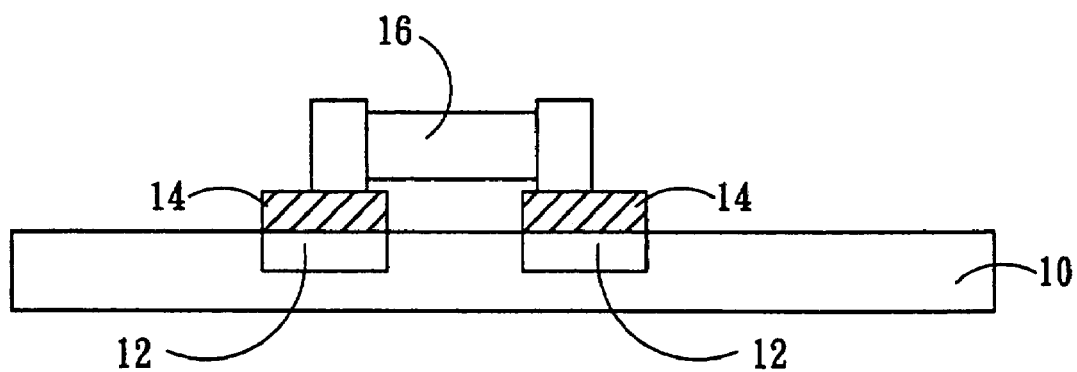
Figure 1C:
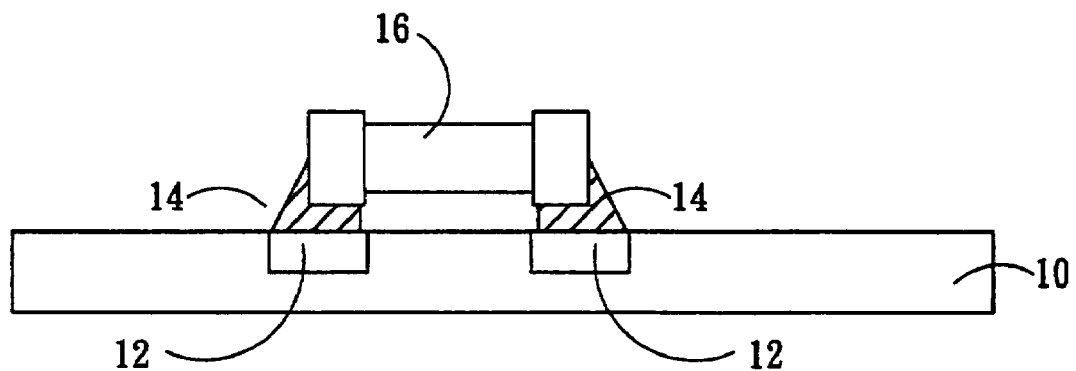
Figure 2:
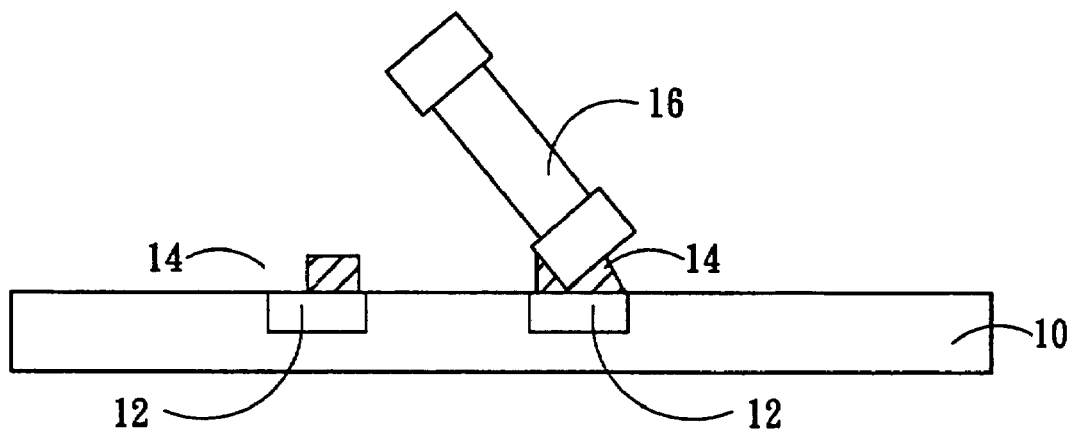
FIG. 2 (Prior Art) illustrates the tombstone problem in the conventional mounting method of the passive component.

A preferred embodiment is described as follow to illustrate the present invention. However, the present invention can be applied to other embodiments in addition to the following one. In other words, the present invention is not limited to the provided embodiment. The scope of the present invention is to be determined according to the claims. Furthermore, when the component or structure in the drawings is described as a single component or structure, the present invention is not limited thereto. When the limitation of the number of the component is not emphasized in the following description, several components or structures can be applied under the spirit of the present invention. Moreover, different parts of each component in the drawings do not reflect the real dimensions. Some dimensions compared to others may be amplified or simplified in order to describe the present invention more clearly. The prior art used in the present invention is only mentioned briefly for illustrating the present invention.

Figure 3A:
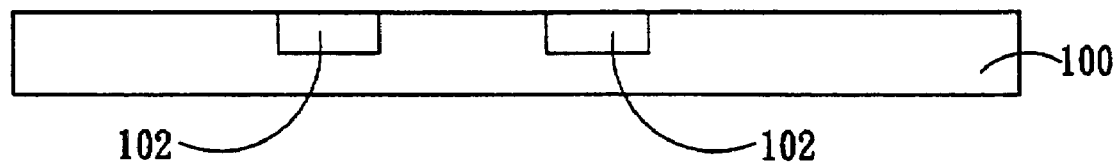
FIGS. 3A~3F show a mounting method of a passive component according to a preferred embodiment of the present invention.
Figure 3B:
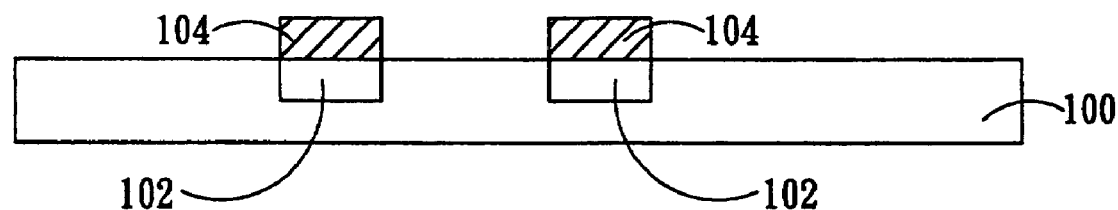

FIGS. 3A~3F show a mounting method of a passive component according to a preferred embodiment of the present invention. The mounting method includes following steps. First, as shown in FIG. 3A, a substrate 100 is provided. A pair of contact pads 102 is disposed on a surface of the substrate 100. However, the number of the contact pads 102 is not limited thereto. The number of the contact pads 102 can be determined according to the product design, the demand and the number of the passive components to be mounted on the substrate 100. Next, as shown in FIG. 3B, an adhesive layer 104 is printed on the surfaces of contact pads 102. The adhesive layer 104 is preferably a solder paste or made of other conductive materials.

Figure 3C:
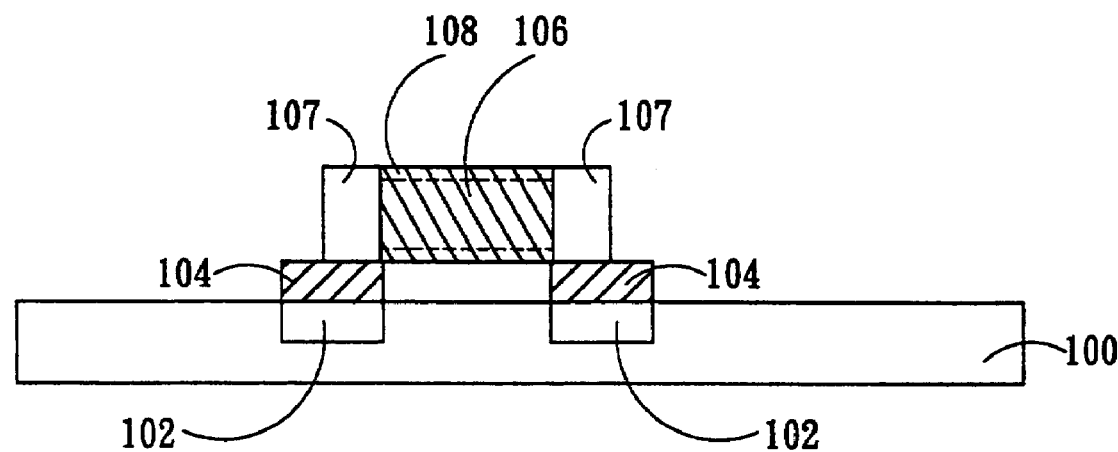

Then, as shown in FIG. 3C, a passive component 106 partially covered by an adhesive material 108 is placed on the adhesive layer 104 of the contact pads 102. In other words, the passive component 106 is placed on the solder paste. The adhesive material 108 only covers a part of the surface of the passive component 106 and exposes the two ends 107 of the passive component 106. The two ends 107 of the passive component 106 contact the adhesive layer 104, so that the passive component 106 is disposed on the adhesive layer 104. Furthermore, each of the two ends 107 of the passive component 106 can be a power contact for being electrically connected to a power source, a ground contact for being electrically connected to a ground or other designs.

Figure 3D:
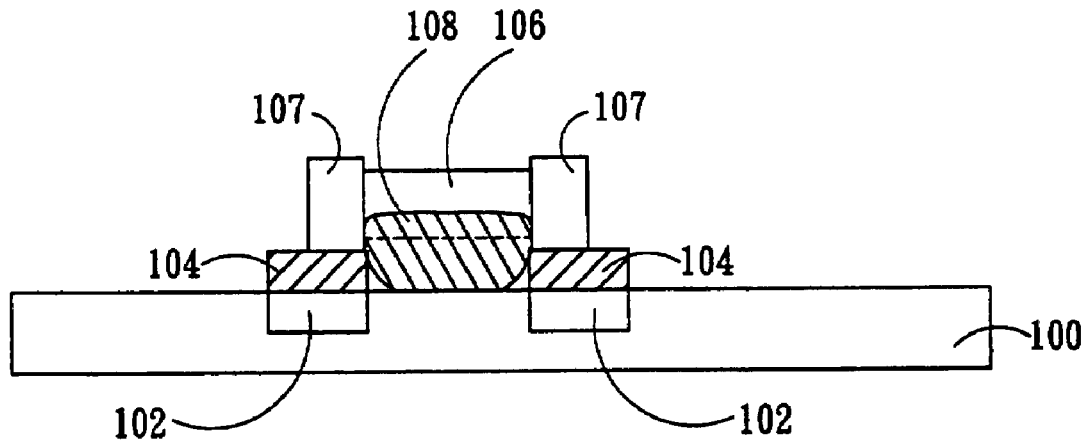
Figure 3E:
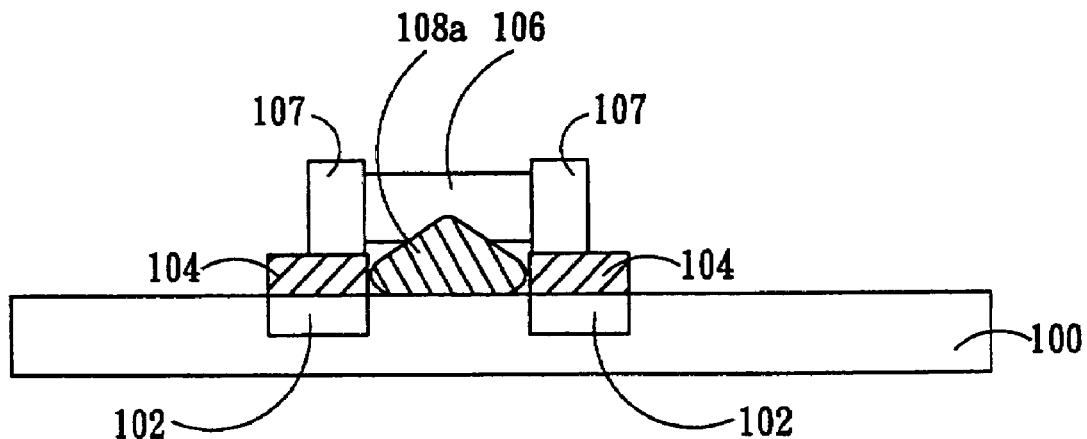

Afterwards, heat treatment is performed on the substrate 100, the adhesive layer 104 and the passive component 106. First, as shown in FIG. 3D, the substrate 100, the adhesive layer 104 and the passive component 106 are heated up to a first temperature, so that the adhesive material 108 partially covering the passive component 106 is melted. The adhesive material 108 flows downward to the surface of the substrate 100 under the passive component 106 for connecting the passive component 106 and the substrate 100. Then, as shown in FIG. 3E, the substrate 100, the adhesive layer 104 and the passive component 106 are heated up to a second temperature, the melted adhesive material 108 is then solidified to form a fixing structure 108a for fixing the passive component 106 on the substrate 100. As a result, the passive component 106 is fixed on the substrate 100.

Figure 3F:
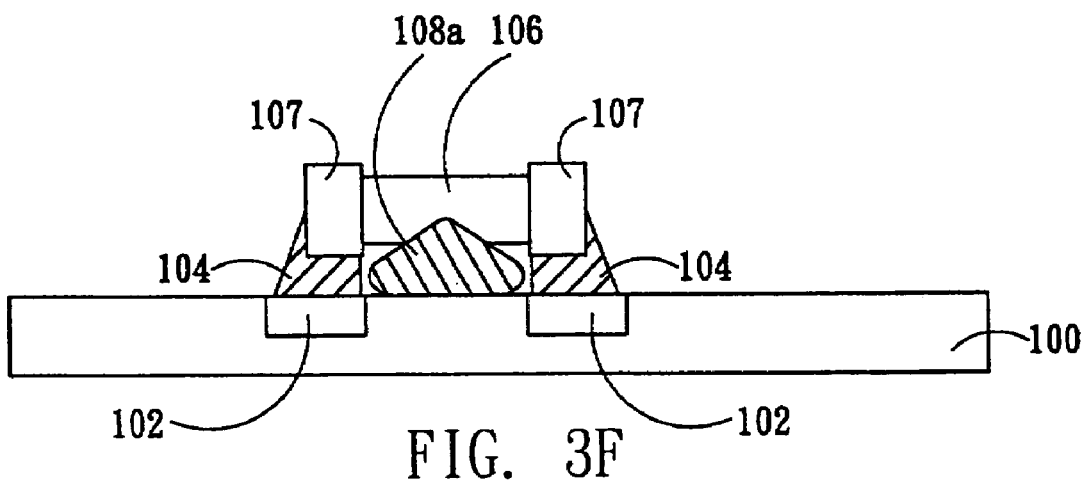

Afterwards, as shown in FIG. 3F, the substrate 100, the adhesive layer 104 and the passive component 106 are heated up to a third temperature, so that the adhesive layer 104 (the solder paste) is melted for bonding the passive component 106 onto the substrate 100. Therefore, the two ends 107 of the passive component 106 are electrically connected to the contact pads 102 of the substrate 100. Before the adhesive layer 104 (the solder paste) is melted, the fixing structure 108a is formed for fixing the passive component 106 on the substrate 100 firmly. Therefore, the tombstone problem is avoided even when the pulling force that the melted solder paste applies to the two ends of the passive component is uneven due to manufacture errors or position errors.

The first temperature is the melting temperature of the adhesive material 108. The second temperature is the solidification temperature of the adhesive material 108. The third temperature is the melting temperature of the adhesive layer 104. The first temperature is lower than the second temperature, and the second temperature is lower than the third temperature. The adhesive material 108 is an insulation material. Preferably, the adhesive material 108 is made of molding compound or another thermoset insulation material whose solidification temperature is higher than its melting temperature. However, the solidification temperature of the adhesive material 108 has to be lower than the melting temperature of the adhesive layer 104. When the adhesive material 108 partially covering the passive component 106 is made of molding component, the first temperature is about 100° C. The second temperature is about 170° C. When the adhesive layer 104 is made of a tin solder paste, the third temperature (the melting temperature of the adhesive layer 104) is about 183° C. However, the temperatures are not limited thereto. The third temperature can be different (higher or lower than 183° C.) according to the type of the solder paste. But the third temperature has to be higher than the second temperature.

Furthermore, according to the demand of the manufacturing process, the steps of heating up to the first temperature, the second temperature and the third temperature can be performed together in a reflowing process. Or, the steps of heating up to the first temperature and the second temperature are performed first, and the step of heating up to the third temperature is performed later in a reflowing process. Moreover, although the present invention is applied to a passive component in the preferred embodiment, the mounting method present invention can be applied to other kinds of components.

A mounting method of a passive component is provided by the present invention. Before the adhesive layer is melted, the adhesive material partially covering the passive component is melted, flowing downward and then solidified. As a result, a fixing structure is formed for fixing the passive component on the substrate. The tombstone problem caused by uneven pulling force that the melted solder applies to the two ends of the passive component is solved effectively. When reflowed, the passive component is not misaligned due to the swaying of the passive component or the flowing of the solder paste. The yield rate is increased, and the product loss is reduced.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A mounting method of a passive component, the method comprising:

providing a substrate comprising a pair of contact pads disposed on a surface of the substrate;

forming an electrically conductive adhesive layer on surfaces of the pair of contact pads;

providing a passive component partially covered by an insulative adhesive material, wherein two ends of the passive component are free of coverage by the insulative adhesive material;

placing the passive component on the substrate so that the two ends of the passive component respectively contact the conductive adhesive layer on the contact pads;

heating the insulative adhesive material to a first temperature so that the insulative adhesive material covering the passive component melts, and flows to and contacts the substrate, after the passive component is placed on the substrate;

heating the melted adhesive material to a second temperature higher than the first temperature for solidifying the insulative adhesive material so that the solidified insulative adhesive material fixes the passive component on the substrate; and performing a reflowing step after the passive component is fixed to the substrate by the solidified insulative adhesive material, wherein the conductive adhesive layer is melted at a third temperature higher than the second temperature and then solidified for bonding and electrically connecting the two ends of the passive component to the contact pads on the substrate, respectively.

2. The method according to claim 1, wherein the electrically conductive material is a solder paste.

3. The method according to claim 1, wherein the insulation insulative adhesive material is a molding compound.

* * * * *